US012751083B2

(12) United States Patent
Xie et al.

(10) Patent No.: US 12,751,083 B2
(45) Date of Patent: Sep. 29, 2026

(54) HYBRID CELL HEIGHT DESIGN WITH A BACKSIDE POWER DISTRIBUTION NETWORK

(71) Applicant: International Business Machines Corporation, Armonk, NY (US)

(72) Inventors: Ruilong Xie, Niskayuna, NY (US); Lawrence A. Clevenger, Saratoga Springs, NY (US); Nicholas Anthony Lanzillo, Wynantskill, NY (US); Albert M. Chu, Nashua, NH (US); Reinaldo Vega, Mahopac, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 727 days.

(21) Appl. No.: 18/067,148

(22) Filed: Dec. 16, 2022

(65) Prior Publication Data

US 2024/0203996 A1 Jun. 20, 2024

(51) Int. Cl.

*H10D 84/90* (2025.01)
*H10D 89/10* (2025.01)
*H10W 20/41* (2026.01)

(52) U.S. Cl.

CPC ........... *H10D 84/907* (2025.01); *H10D 89/10* (2025.01); *H10W 20/427* (2026.01); (Continued)

(58) Field of Classification Search

CPC .... H10D 84/907; H10D 89/10; H10D 84/981; H01L 23/5286

See application file for complete search history.

(56) References Cited

U.S. PATENT DOCUMENTS 6,111,310 A * 8/2000 Schultz ............... H01L 23/5286 257/691
6,346,721 B1 * 2/2002 Schultz ............... H01L 23/5286 257/E23.153

(Continued)

FOREIGN PATENT DOCUMENTS

CN 102626585 A 8/2012
CN 202778237 U 3/2013

(Continued)

OTHER PUBLICATIONS

International Office Action; International Application No. 112119240; International Filing Date: May 24, 2023; Date of mailing: Mar. 14, 2024 ; 10 pages.

*Primary Examiner* — Mounir S Amer
*Assistant Examiner* — Alexander Belousov
(74) *Attorney, Agent, or Firm* — Cantor Colburn LLP; Kimberly Zillig

(57) ABSTRACT

Embodiments of the invention provide a multi-layer integrated circuit (IC) structure that includes a back-end-of-line (BEOL) region at a first side of a wafer. A backside region is at a second side of the wafer that is opposite the first side of the wafer. A set of signal lines are in the BEOL region, and a set of power rails are in the backside region. The set of signal lines includes a substantially constant signal-line pitch between each signal line in the set of signal lines. The set of power rails includes a substantially varying power-rail pitch between each power rail in the set of power rails.

19 Claims, 12 Drawing Sheets

(52) U.S. Cl.
CPC ......... *H10D 84/916* (2025.01); *H10D 84/975* (2025.01); *H10D 84/981* (2025.01)

(56) References Cited

U.S. PATENT DOCUMENTS

| | | | | |
|---|---|---|---|---|
| 7,086,024 | B2 * | 8/2006 | Hsu | H01L 23/5286 716/120 |
| 7,855,579 | B2 * | 12/2010 | Fujiyama | H01L 23/5286 257/500 |
| 8,151,238 | B2 * | 4/2012 | Fujiyama | H01L 23/5286 716/133 |
| 8,336,018 | B2 * | 12/2012 | Turner | H01L 23/5286 716/133 |
| 10,998,340 | B2 | 5/2021 | Guo et al. | |
| 11,011,545 | B2 | 5/2021 | Guo et al. | |
| 11,170,152 | B2 | 11/2021 | Chen et al. | |
| 11,443,777 | B2 | 9/2022 | Chen et al. | |
| 11,557,583 | B2 * | 1/2023 | Chen | H10D 89/10 |
| 11,756,887 | B2 * | 9/2023 | Lanzillo | H01L 23/535 257/734 |
| 2004/0243960 | A1 * | 12/2004 | Hsu | H01L 23/5286 257/E23.153 |
| 2007/0124715 | A1 * | 5/2007 | Fujiyama | H01L 23/5286 716/132 |
| 2011/0057320 | A1 * | 3/2011 | Fujiyama | H01L 23/5286 257/773 |
| 2011/0304052 | A1 * | 12/2011 | Turner | G06F 30/394 257/E23.079 |
| 2019/0251224 | A1 | 8/2019 | Wang et al. | |
| 2020/0273851 | A1 | 8/2020 | Liaw | |
| 2021/0286927 | A1 | 9/2021 | Sio et al. | |
| 2021/0305151 | A1 * | 9/2021 | Sakai | H10D 89/10 |
| 2021/0344346 | A1 | 11/2021 | Sio et al. | |
| 2022/0077134 | A1 * | 3/2022 | Chen | H10D 89/10 |
| 2022/0084561 | A1 | 3/2022 | Chen et al. | |
| 2022/0114320 | A1 | 4/2022 | Yu et al. | |
| 2022/0139901 | A1 | 5/2022 | Cho et al. | |
| 2022/0180037 | A1 | 6/2022 | Sherlekar et al. | |
| 2022/0254769 | A1 | 8/2022 | Sio et al. | |
| 2022/0262791 | A1 | 8/2022 | Shi et al. | |
| 2022/0359492 | A1 * | 11/2022 | Liu | H10D 89/10 |
| 2022/0382949 | A1 * | 12/2022 | Lee | G06F 30/392 |
| 2022/0406717 | A1 * | 12/2022 | Lanzillo | H01L 23/5226 |
| 2024/0203996 | A1 * | 6/2024 | Xie | H01L 23/5286 |
| 2024/0232500 | A1 * | 7/2024 | Liu | G06F 30/392 |

FOREIGN PATENT DOCUMENTS

| | | | |
|---|---|---|---|
| CN | 104096506 | B | 8/2016 |
| TW | 202215283 | A | 4/2022 |
| TW | 202224043 | A | 6/2022 |
| TW | 202245195 | A | 11/2022 |
| TW | 202247391 | A | 12/2022 |

* cited by examiner

Y2-side View

Y1-side View

HYBRID CELL HEIGHT DESIGN WITH A BACKSIDE POWER DISTRIBUTION NETWORK

BACKGROUND

The present invention generally relates to fabrication methods and resulting structures for integrated circuit (IC) wafers. More specifically, the present invention relates to fabrication methods and resulting structures for providing a hybrid cell height design having a backside power distribution network.

ICs are fabricated in a series of stages, including a front-end-of-line (FEOL) stage, a middle-of-line (MOL) stage, and a back-end-of-line (BEOL) stage. The FEOL stage is where device elements (e.g., transistors) are patterned in the substrate/wafer. The MOL stage forms interconnect structures (e.g., lines, wires, metal-filled vias, contacts, and the like) that communicatively couple to active regions (e.g., gate, source, and drain) of the device element. Layers of interconnect structures are formed above these logical and functional layers during the BEOL stage to complete the IC.

As the semiconductor industry moves towards smaller nodes, for example 7-nm node and beyond, field-effect-transistors (FETs) are aggressively scaled in order to fit into the reduced footprint or real estate, which is often dictated by the node size, with increased device density. In addition, so-called backside power distribution networks (BSPDNs) have been introduced as a means to further enhance device density. Generally, a BSPDN provides power to a mixture of signal lines and power rails in the BEOL region of the wafer, and the power rails in turn provide the power from the BSPDN to active FEOL devices such as FETs.

ICs are designed by placing various cells with different functions. For example, cells can be logic gates, such as an AND gate, an OR gate, and the like, and combinational logic circuits such as a multiplexer, a flip-flop, an adder, and a counter. Cells can be implemented to realize complex IC functions. For convenience of IC design, a library including frequently used cells with their corresponding layouts are established. Therefore, when designing an IC, a designer can select desired cells from the library and place the selected cell in an automatic placement and routing block, such that a layout of the IC can be created.

In some applications, it is desirable to provide cell libraries having different components configurations that can result in cell libraries having different height dimensions. The height of a cell library can be measured by the total number of signal lines and power rails that are provided for the cell library. Each signal line and each power rail can be referred to as a track (T), and thus, cell height can be identified by the total number of cell tracks (T) associated with the cell library. A cell library that requires five (5) signal lines, ½ of a power rail at a first cell boundary, and ½ of a power rail at a second cell boundary, requires six (6) total tracks. Accordingly, such a cell library can be identified as a 6T cell. Similarly, a cell library that requires eight (8) signal lines, ½ of a power rail at a first cell boundary, and ½ of a power rail at a second cell boundary, requires nine (9) total tracks. Accordingly, such a cell library can be identified as a 9T cell. Because the width of signal lines are each substantially uniform, and because the width of power rails are each substantially uniform and larger than the width of signal lines, the height of a 6T cell is smaller than the height of a 9T cell.

Fabricating ICs having different cell heights (e.g., 6T cells mixed with 9T cells) is a challenge because the different cell heights and different track widths (power rails wider than signal lines) mean that the signal lines and power rails for adjacent or neighboring cell libraries will formed in a pattern whereby at least some of the signal lines and/or power rails in the 6T cell region will not align with corresponding signal lines and/or power rails in the 9T region, and it is difficult to form a pattern of signal lines and power rails at a certain density level where the signal lines and power rails extend over the 6T region and the 9T region in a pattern that is not a substantially straight line and requires irregular shapes or patterns in the signal lines and power rails to accommodate the different cell heights.

SUMMARY

Embodiments of the invention provide a multi-layer integrated circuit (IC) structure that includes a back-end-of-line (BEOL) region at a first side of a wafer. A backside region is at a second side of the wafer that is opposite the first side of the wafer. A set of signal lines are in the BEOL region, and a set of power rails are in the backside region. The set of signal lines includes a substantially constant signal-line pitch between each signal line in the set of signal lines. The set of power rails includes a substantially varying power-rail pitch between each power rail in the set of power rails.

The above-described features in accordance with aspects of the invention provide technical effects and benefits that address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a pattern where power rails in the lower-height cell library (e.g., a 6T region) are not aligned with the power rails in the adjacent greater-height cell library (e.g., a 9T region).

Embodiments of the invention provide a multi-layer IC structure that includes a first region at a first side of a wafer. A second region is at a second side of the wafer that is opposite the first side of the wafer. A third region of the wafer is between the first region and the second region. A set of signal lines is in the first region, and a set of power rails is in the second region. A first cell is positioned in the third region, and a second cell is adjacent to the first cell and positioned in the third region. A backside power distribution network (BSPDN) is electrically coupled to the set of power rails. The set of signal lines includes a signal-line pitch between each signal line in the set of signal lines. The set of power rails includes a power-rail pitch between each power rail in the set of power rails. The power-rail pitch substantially varies, and the signal-line pitch does not substantially vary.

The above-described features in accordance with aspects of the invention provide technical effects and benefits that address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a pattern where power rails in the lower-height cell library (e.g., a 6T region) are not aligned with the power rails in the adjacent greater-height cell library (e.g., a 9T region).

Embodiments of the invention provide a multi-layer IC structure that includes a BEOL region at a first side of a wafer. A backside region is at a second side of the wafer that is opposite the first side of the wafer. A front-end-of-line (FEOL) region of the wafer is between the BEOL region and the backside region. A set of signal lines is in the BEOL region. A set of power rails is in the backside region. A first cell is positioned in the FEOL region and includes a first cell height. A second cell is adjacent to the first cell, positioned in the FEOL region, and includes a second cell height that is greater than the first cell height. A BSPDN is electrically coupled to the set of power rails. The set of signal lines includes a signal-line pitch between each signal line in the set of signal lines. The set of power rails includes a power-rail pitch between each power rail in the set of power rails. The power-rail pitch substantially varies, and the signal-line pitch does not substantially vary.

The above-described features in accordance with aspects of the invention provide technical effects and benefits that address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a pattern where power rails in the lower-height cell library (e.g., a 6T region) are not aligned with the power rails in the adjacent greater-height cell library (e.g., a 9T region).

Embodiments of the invention provide a method of forming a multi-layer IC structure that includes forming a BEOL region at a first side of a wafer. A backside region is formed at a second side of the wafer that is opposite the first side of the wafer. A set of signal lines are formed in the BEOL region, and a set of power rails are formed in the backside region. The set of signal lines includes a substantially constant signal-line pitch between each signal line in the set of signal lines. The set of power rails includes a substantially varying power-rail pitch between each power rail in the set of power rails.

The above-described features in accordance with aspects of the invention provide technical effects and benefits that address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a pattern where power rails in the lower-height cell library (e.g., a 6T region) are not aligned with the power rails in the adjacent greater-height cell library (e.g., a 9T region).

Embodiments of the invention provide a method of forming a multi-layer IC structure that includes forming a first region at a first side of a wafer. A second region is formed at a second side of the wafer that is opposite the first side of the wafer. A third region of the wafer is formed between the first region and the second region. A set of signal lines is formed in the first region, and a set of power rails is formed in the second region. A first cell is formed in the third region, and a second cell is formed adjacent to the first cell and positioned in the third region. A BSPDN is formed and electrically coupled to the set of power rails. The set of signal lines includes a signal-line pitch between each signal line in the set of signal lines. The set of power rails includes a power-rail pitch between each power rail in the set of power rails. The power-rail pitch substantially varies, and the signal-line pitch does not substantially vary.

The above-described features in accordance with aspects of the invention provide technical effects and benefits that address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a pattern where power rails in the lower-height cell library (e.g., a 6T region) are not aligned with the power rails in the adjacent greater-height cell library (e.g., a 9T region).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 5A-10B depict the results of fabrication operations for forming the portion of the IC wafer shown in FIGS. 4A and 4B in accordance with embodiments of the invention, in which:

FIG. 5A depicts a Y1-side cross-sectional view of the portion of the IC wafer after fabrication operations according to embodiments of the invention;

FIG. 10B depicts a Y2-side cross-sectional view of the portion of the IC wafer after fabrication operations according to embodiments of the invention.

Figure 1:
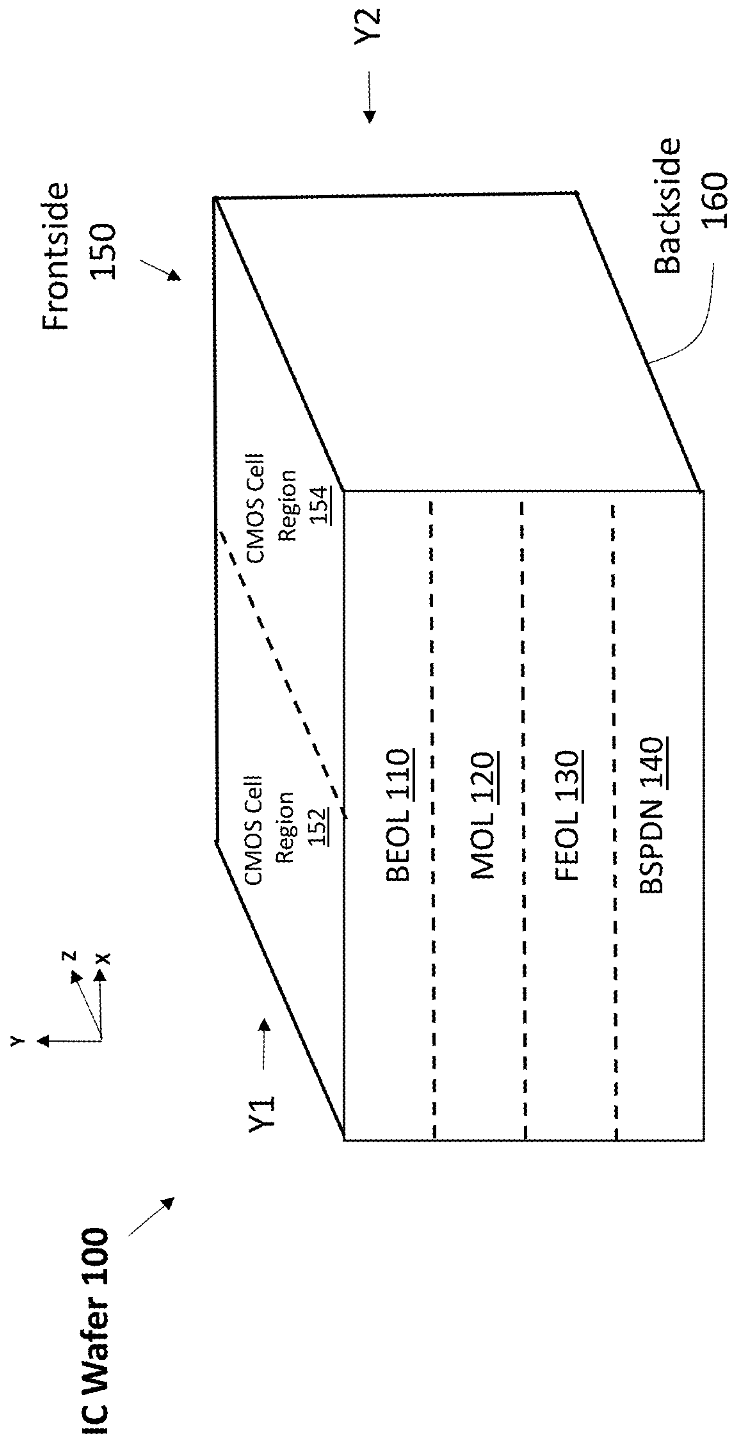
FIG. 1 depicts a three-dimensional view of a portion of an IC wafer that incorporates aspects of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two- or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. In the BEOL stage, these device elements are connected to each other through a network of interconnect structures to distribute signals, as well as power and ground. The conductive interconnect layers formed during the BEOL stage serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metallization layers, complex ICs can have ten or more layers of wiring.

As previously noted herein, ICs are designed by placing various cells with different functions. For example, cells can be logic gates, such as an AND gate, an OR gate, and the like, and combinational logic circuits such as a multiplexer, a flip-flop, an adder, and a counter. Cells can be implemented to realize complex IC functions. For convenience of IC design, a library including frequently used cells with their corresponding layouts are established. Therefore, when designing an IC, a designer can select desired cells from the library and place the selected cell in an automatic placement and routing block, such that a layout of the IC can be created.

As also previously noted herein, in some applications, it is desirable to provide cell libraries having different components configurations that can result in cell libraries having different height dimensions. The height of a cell library can be measured by the total number of signal lines and power rails that are provided for the cell library. Each signal line and each power rail can be referred to as a track (T), and thus, cell height can be identified by the total number of cell tracks (T) associated with the cell library. A cell library that requires five (5) signal lines, ½ of a power rail at a first cell boundary, and ½ of a power rail at a second cell boundary, requires six (6) total tracks. Accordingly, such a cell library can be identified as a 6T cell. Similarly, a cell library that requires eight (8) signal lines, ½ of a power rail at a first cell boundary, and ½ of a power rail at a second cell boundary, requires nine (9) total tracks. Accordingly, such a cell library can be identified as a 9T cell. Because the width of signal lines are each substantially uniform, and because the width of power rails are each substantially uniform and larger than the width of signal lines, the height of a 6T cell is smaller than the height of a 9T cell.

Thus, fabricating ICs having different cell heights (e.g., 6T cells mixed with 9T cells) is a challenge because the different cell heights and different track widths (power rails wider than signal lines) mean that the signal lines and power rails for adjacent or neighboring cell libraries will formed in a pattern whereby at least some of the signal lines and/or power rails in the 6T cell region will not align with corresponding signal lines and/or power rails in the 9T region, and it is difficult to form a pattern of signal lines and power rails at a certain density level where the signal lines and power rails extend over the 6T region and the 9T region in a pattern that is not a substantially straight line and requires irregular shapes or patterns in the signal lines and power rails to accommodate the different cell heights.

Turning now to an overview of the aspects of the invention, embodiments of the invention address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a patterned where power rails in the lower-height cell library (e.g., a 6T region) are not aligned with the power rails in the adjacent greater-height cell library (e.g., a 9T region).

A non-limiting embodiment of the invention includes a multi-layer wafer having a first CMOS cell region with a first cell height, along with an adjacent or neighboring second CMOS cell region with a second cell height. The second cell height is greater than the first cell height. On a frontside of the wafer, lower BEOL wires of the wafer include signal lines/wires with each of the signal lines/wires having substantially equal pitch in the first CMOS cell region and in the second CMOS cell region. On the backside of the wafer, backside power rails are provided that having different pitches, with the backside power rail pitch in the second CMOS cell region being larger than the backside rail pitch in the first CMOS cell region.

Turning now to a more detailed description of aspects of the present invention, FIG. 1 depicts a portion of an IC wafer 100 in accordance with aspects of the invention; The IC wafer 100 includes a middle-of-line (MOL) region 120 and a front-end-of-line (FEOL) region 130 positioned below a multi-layered BEOL region 110. The individual components (transistors, capacitors, etc.) and cell libraries are fabricated in the FEOL region 130. The MOL region 120 follows the FEOL region 130 and typically includes process flows for forming the contacts and other structures that communicatively couple to active regions (e.g., gate, source, and drain) of the device element. In the BEOL region 110, these device elements are connected to each other through a network of interconnect structures to distribute signals, as well as power and ground. The conductive interconnect layers formed during the BEOL region 110 serve as a network of pathways that transport signals throughout the IC wafer 100, thereby connecting circuit components of the IC wafer 100 into a functioning whole and to the outside world. Because there typically isn't enough room on the chip surface to create all of the necessary connections in a single layer, chip manufacturers build vertical levels of interconnects. While simpler IC wafers can have just a few metallization layers, complex ICs can have ten or more layers of wiring.

Interconnect structure in the BEOL region 110 that are physically close to components (e.g., transistors and the like) in the FEOL region 130 need to be small because they attach/join to the components that are themselves very small and often closely packed together. These lower-level lines, which can be referred to as local interconnects, are usually thin and short in length. Global interconnects are higher up in the structure of the IC wafer 100 and travel between different blocks of the circuit. Thus, global interconnects are typically thick, long, and more widely separated than local interconnects. Vertical connections between interconnect levels (or layers) are known as metal-filled vias and allow signals and power to be transmitted from one layer to the next. For example, a through-silicon via (TSV) is a conductive contact that passes completely through a given semiconductor wafer or die. In multi-layer IC configurations, for example, a TSV can be used to form vertical interconnections between a semiconductor device located on one layer/level of the IC and an interconnect layer located on another layer/level of the IC. These vertical interconnect structures include an appropriate metal and provide the electrical connection of the various stacked metallization layers.

As shown further shown in FIG. 1, the IC wafer 100 includes a frontside 150 and a backside 160. At the backside of the wafer is a BSPDN 140. The frontside 150 of the wafer 100 includes a CMOS cell region 152 and a CMOS cell region 154. In accordance with aspects of the invention, the CMOS cell regions 152, 154 include multiple cell libraries, and the cell libraries In the CMOS cell region 152 can have a different height than the cell libraries in the CMOS cell region 154. The notation Y1 indicates a side view of the wafer 100 looking into the CMOS cell region 152. The notation Y2 indicates a side view of the wafer 100 looking into the CMOS cell region 154.

Figure 2A:
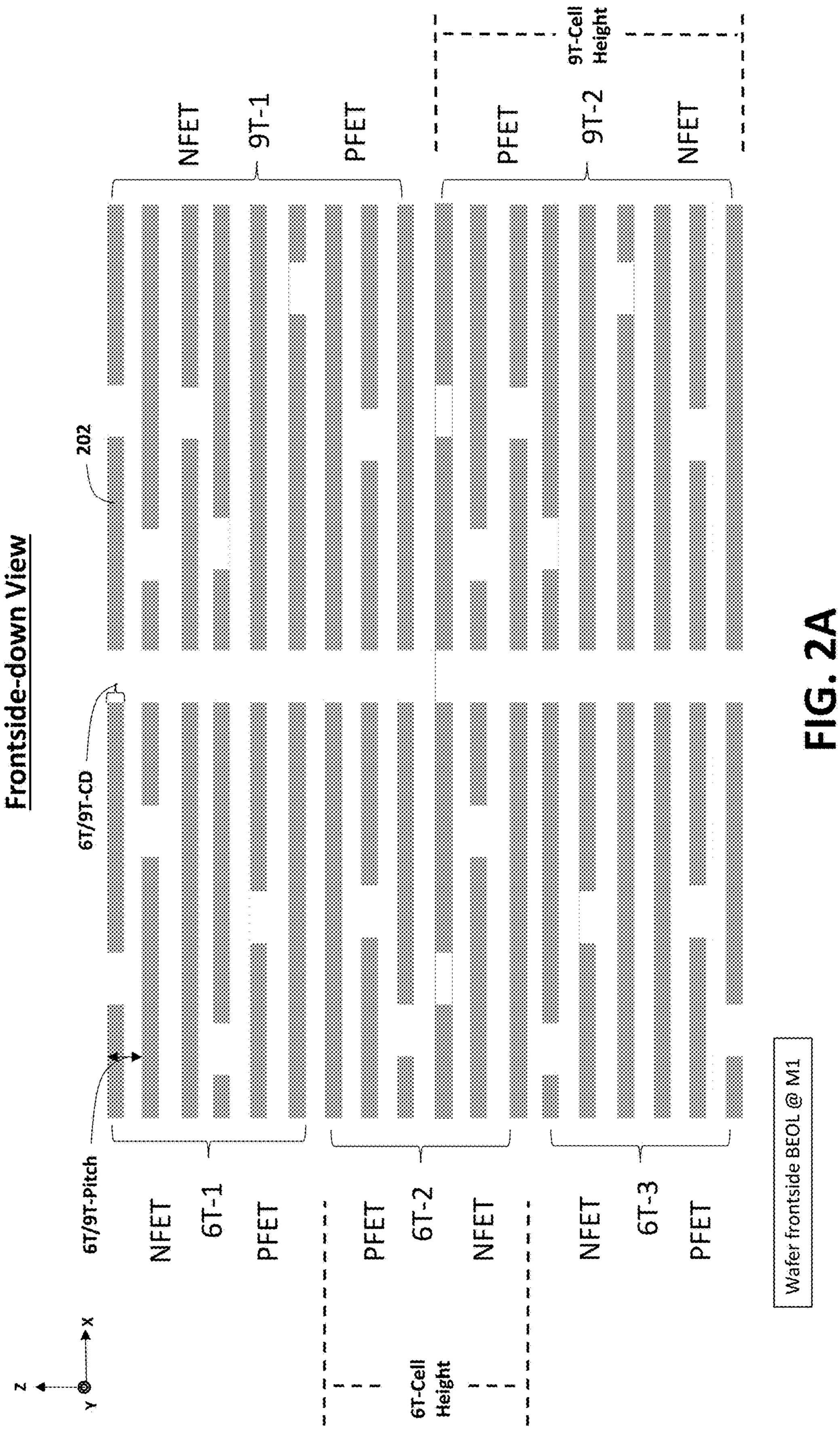
FIG. 2A depicts a frontside-down cross-sectional view of the IC wafer shown in FIG. 1 and incorporating aspects of the invention.
Figure 2B:
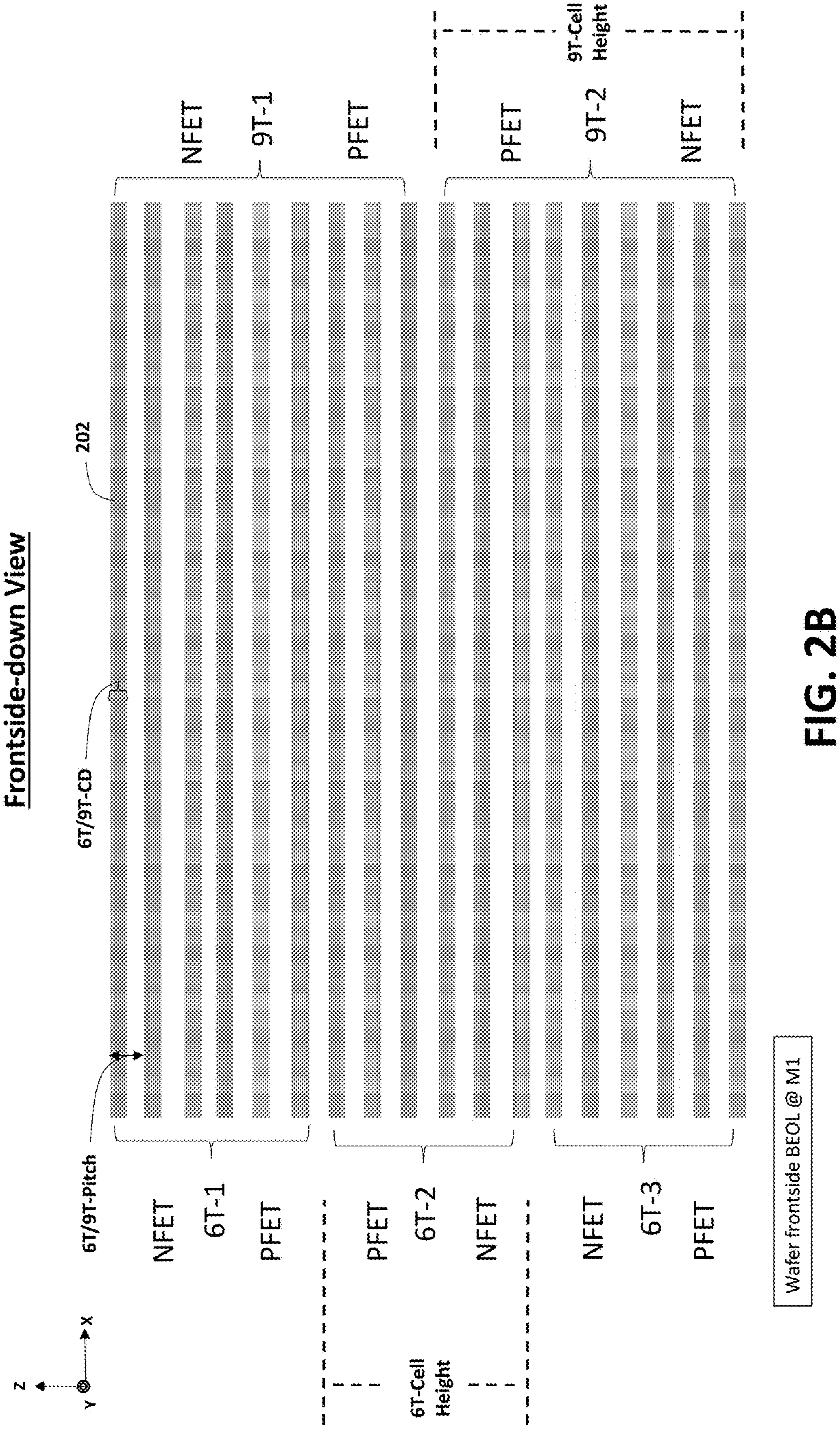
FIG. 2B depicts a frontside-down cross-sectional view of the IC wafer shown in FIG. 1 and incorporating aspects of the invention.
Figure 3A:
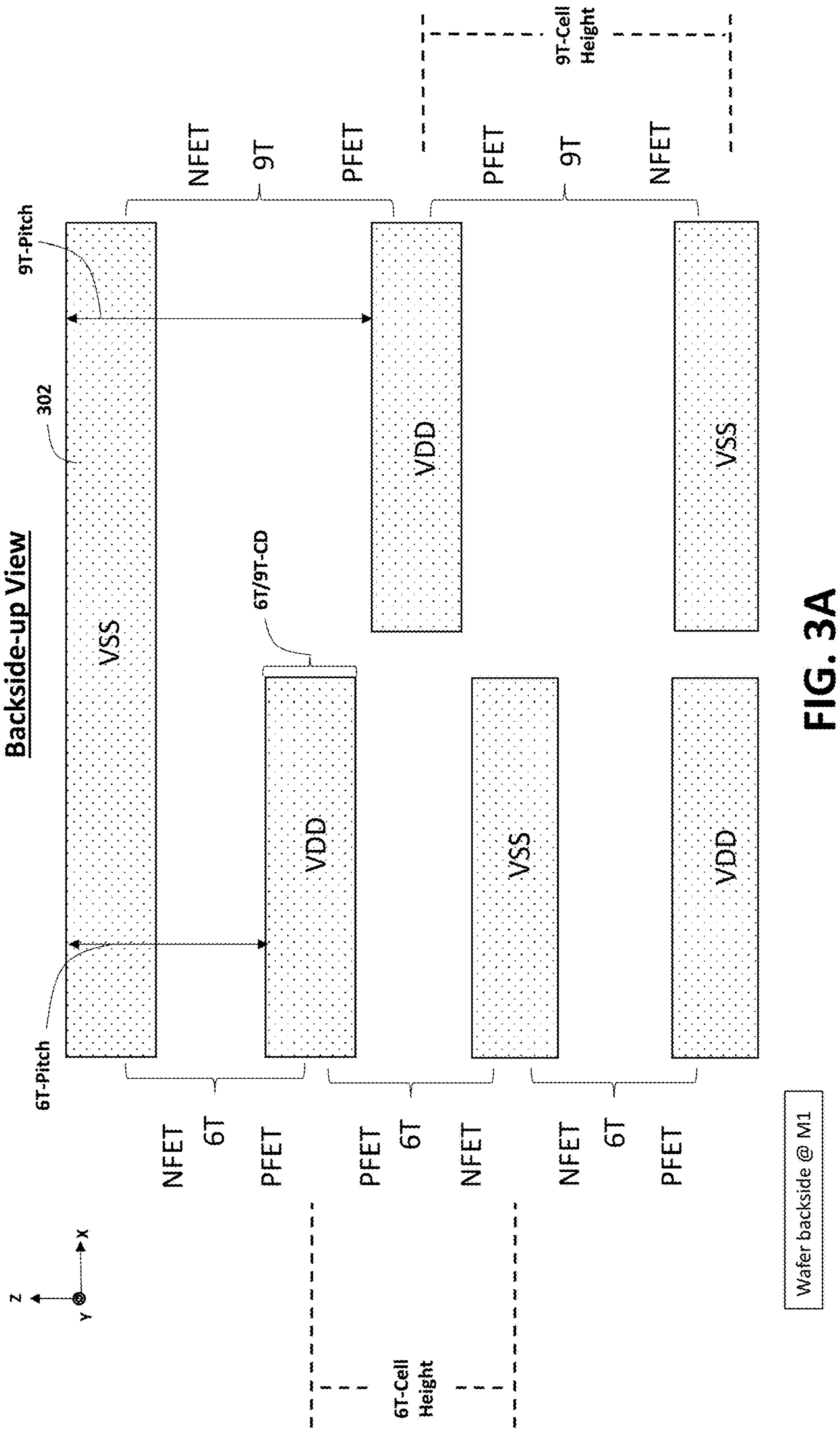
FIG. 3A depicts a backside-up cross-sectional view of the IC wafer shown in FIG. 1 and incorporating aspects of the invention.
Figure 3B:
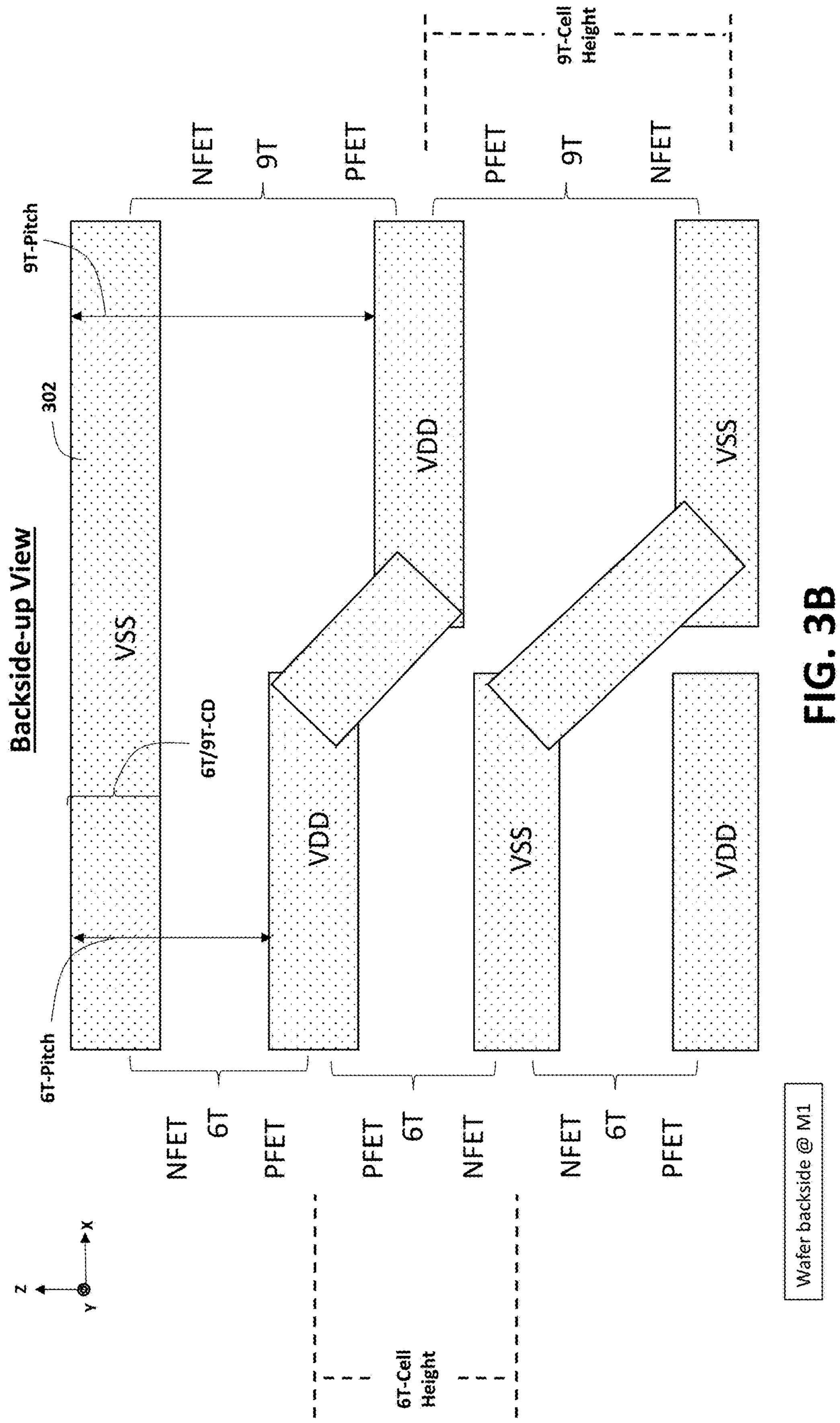
FIG. 3B depicts a backside-up cross-sectional view of the IC wafer shown in FIG. 1 and incorporating aspects of the invention.

FIGS. 2A and 2B depict a frontside-down view of the IC wafer 100 that depicts the signal lines 202 positioned in a lower layer (e.g., M1) of the BEOL region 110 (shown in FIG. 1). FIGS. 2A and 2B are substantially the same except in FIG. 2A, the signal lines 202 are not continuous, and in FIG. 2B, the signal lines 202 are continuous. FIGS. 3A and 3B depict a backside-up view of the IC wafer 100 that depicts the backside power rails 302 positioned in a backside layer (e.g., backside M1) at the backside 160 (shown in FIG. 1) of the BEOL region 110 (shown in FIG. 1). FIGS. 3A and 3B are substantially the same except in FIG. 3A, the backside power rails 302 are not continuous, and in FIG. 3B, the backside power rails 302 are continuous. In accordance with embodiments of the invention, the difficulty in fabricating mixed signal lines and power rails for cell libraries having different heights is addressed by forming the signal lines 202 having the 6T/9T-CD (critical dimension, or width dimension), the 6T/9T-Pitch, and corresponding to the 6T-Cell Height and the 9T-Cell Height as shown in FIGS. 2A, 2B. In accordance with embodiments of the invention, the difficulty in fabricating mixed signal lines and power rails for cell libraries having different heights is also addressed by forming the signal lines 202 having the 6T/9T-CD (critical dimension, or width dimension), the 6T-Pitch, the 9T-Pitch, and corresponding to the 6T-Cell Height and the 9T-Cell Height as shown in FIGS. 3A, 3B. By separating the relatively thin and more densely packed signal lines 202 (shown in FIGS. 2A, 2B) from the relatively thicker and spread apart backside power rails 302 (shown in FIGS. 2A, 2B), the signal lines 202 can be patterned and formed in substantially straight lines with no irregular shapes; and the backside power rails 302, by virtue of being thicker and spaced further apart, can better accommodate being formed in a patterned where backside power rails 302 in the lower-height cell library (e.g., the 6T region) are not all aligned with the backside power rails 302 in the adjacent greater-height cell library (e.g., a 9T region).

Figure 4B:
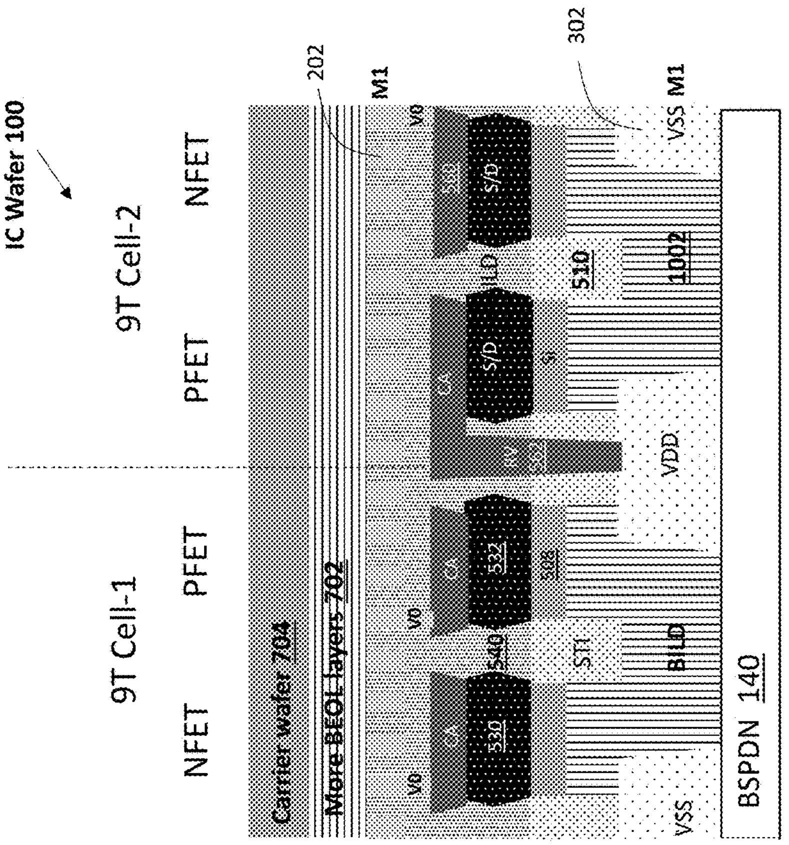
FIG. 4B depicts a Y2-side cross-sectional view of a portion of the IC wafer shown in FIG. 1 incorporating aspects of the invention.
Figure 4A:
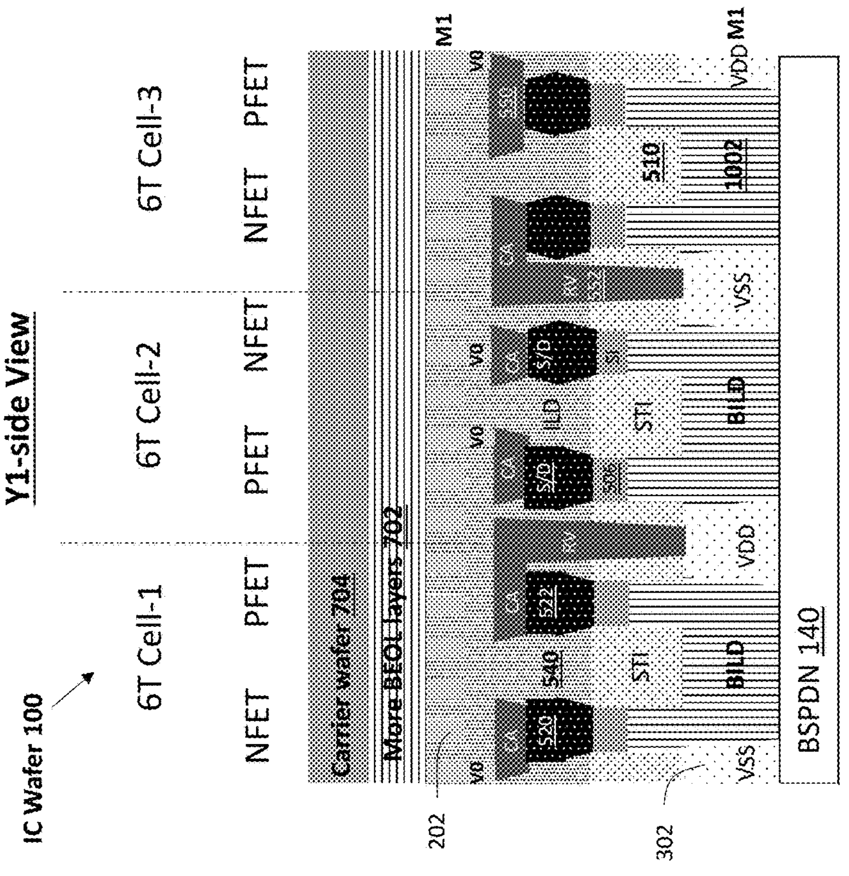
FIG. 4A depicts a Y1-side cross-sectional view of a portion of the IC wafer shown in FIG. 1 incorporating aspects of the invention.

FIG. 4A depicts a Y1-side cross-sectional view of a portion of the IC wafer 100, which shows the 6T cells (6T Cell-1, 6T Cell-2, 6T Cell-3) in accordance with aspects of the invention; and FIG. 4B depicts a Y2-side cross-sectional view of the portion of the IC wafer 100, which shows the 9T cells (9T Cell-1 and 9T Cell-2) in accordance with aspects of the invention. As shown, the signal lines 202 are positioned in an M1 metallization layer of the BEOL region 110 (shown in FIG. 1) and can be coupled through CA contacts 550, 560 to various active regions (e.g., source/drain (S/D) regions 520, 522, 530, 532) of various semiconductor device (e.g., various types of non-planar transistor such as vertical transport field effect transistors (VTFET)). Similarly, the backside power rails 302 can couple power from the BSPDN 140 through via lines (RV) 552, 562 to the contacts (CA) 550, 552. The IC wafer 100 further includes various stabilizing and insulating dielectric regions, including shallow trench isolation (STI) layer 510, interlayer dielectric (ILD) 540, and backside interlevel dielectric (BILD) layer 1002, configured and arranged as shown.

Figure 5B:
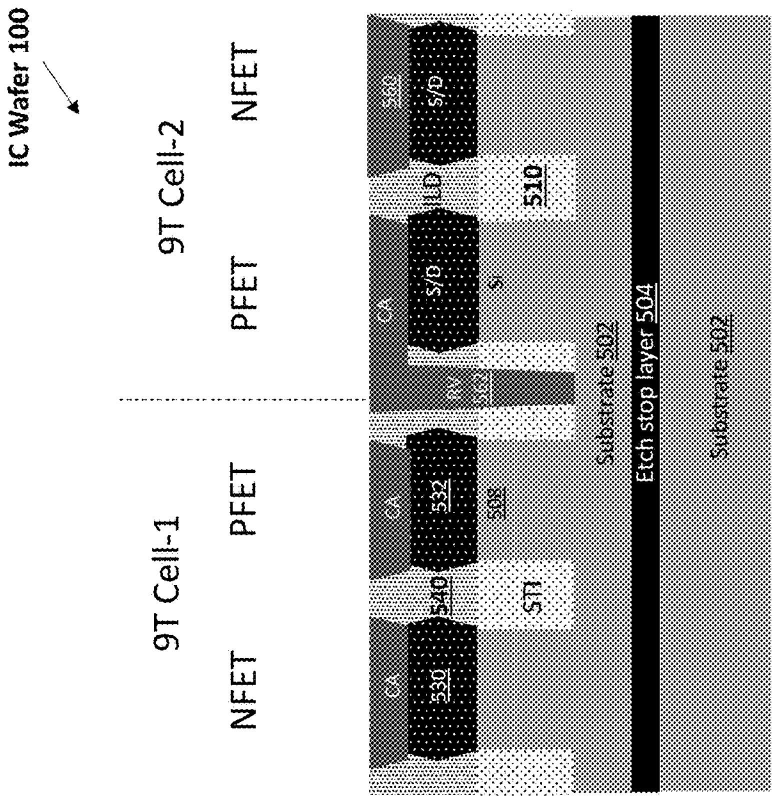
FIG. 5B depicts a Y2-side cross-sectional view of the portion of the IC wafer after fabrication operations according to embodiments of the invention.
Figure 5A:
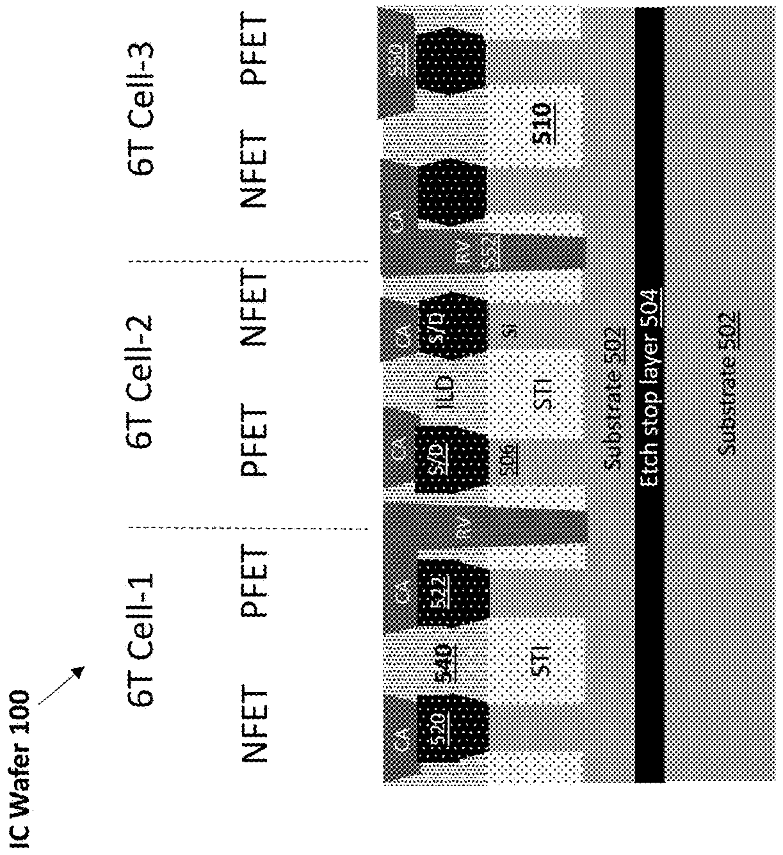

FIGS. 5A-10B depict the results of fabrication operations for the IC wafer 100 shown in FIGS. 4A, 4B. Referring first to FIGS. 5A and 5B, FIGS. 5A and 5B are demonstrative illustrations of different cross-sectional views of the IC wafer 100 in steps of manufacturing thereof. Known semiconductor fabrication operations have been performed to construct the IC wafer 100 to the FEOL and MOL fabrication stage shown, where the IC wafer 100 includes a Si bulk substrate 502, an etch stop layer 504, a device channel region 506, 508 (e.g., a channel fin), semiconductor devices (e.g., various types of non-planar transistors having active S/D regions), dielectric regions (ILD 540, STI layer 510), contacts (CA) 550, 560, and vias (RV) 552, 562, configured and arranged as shown. The Y1-side view corresponds to the CMOS cell region 152 (shown in FIG. 1), and the Y2-side view corresponds to the CMOS cell region 154 (shown in FIG. 1). The active S/D regions 520, 522 of the semiconductor devices in the CMOS cell region 152 are smaller that the active S/D regions 530, 532 of the semiconductor devices in the CMOS cell region 154.

Figure 6B:
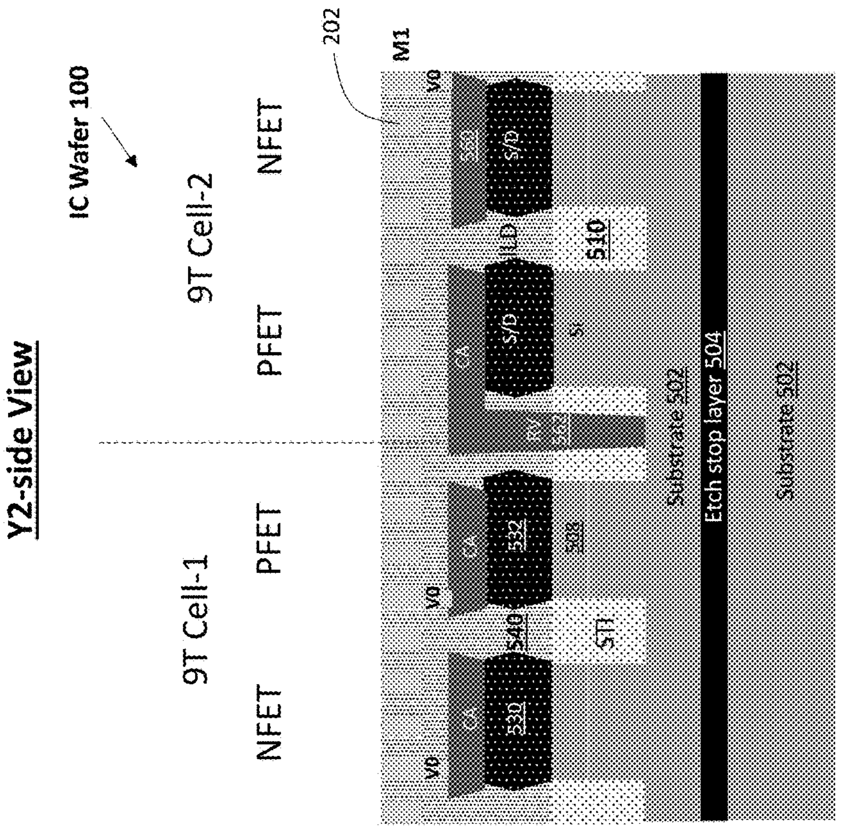
FIG. 6B depicts a Y2-side cross-sectional view of the portion of the IC wafer after fabrication operations according to embodiments of the invention.
Figure 6A:
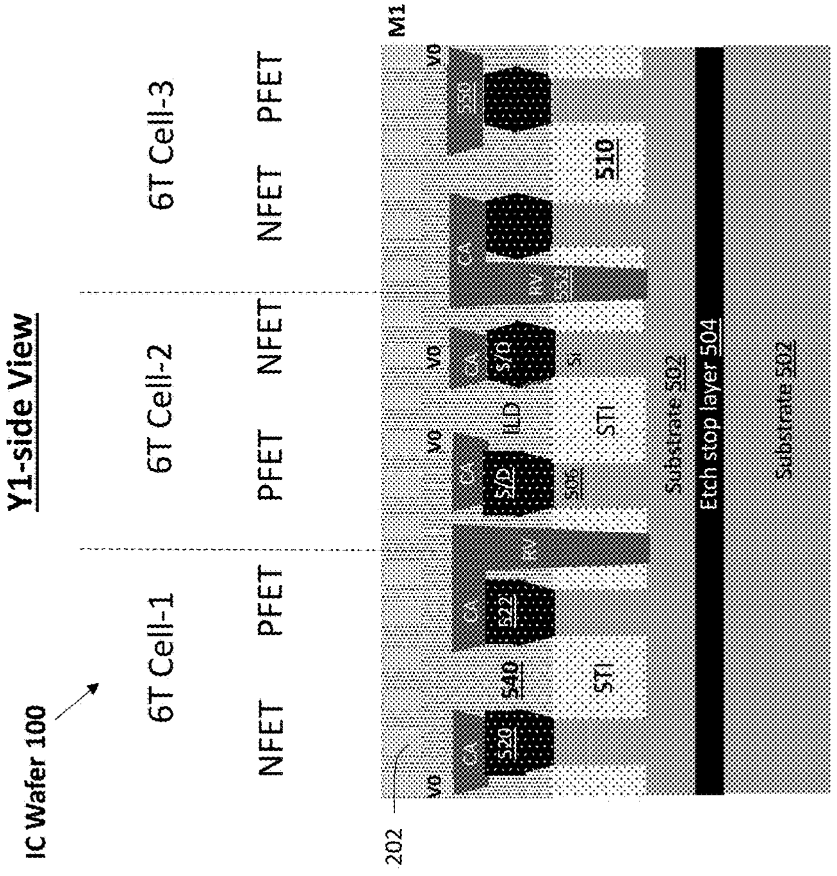
FIG. 6A depicts a Y1-side cross-sectional view of the portion of the IC wafer after fabrication operations according to embodiments of the invention.

FIGS. 6A and 6B are demonstrative illustrations of different cross-sectional views of the IC wafer 100 in steps of manufacturing thereof, subsequent to the steps illustrated in FIGS. 5A and 5B, according to embodiments of the invention. Known semiconductor fabrication operations (e.g., a damascene operation) have been performed to extend the ILD 540 and construct therein the signal lines 202 and selected VO regions that couple selected signal lines 202 to selected contacts 550, 560.

Figure 7B:
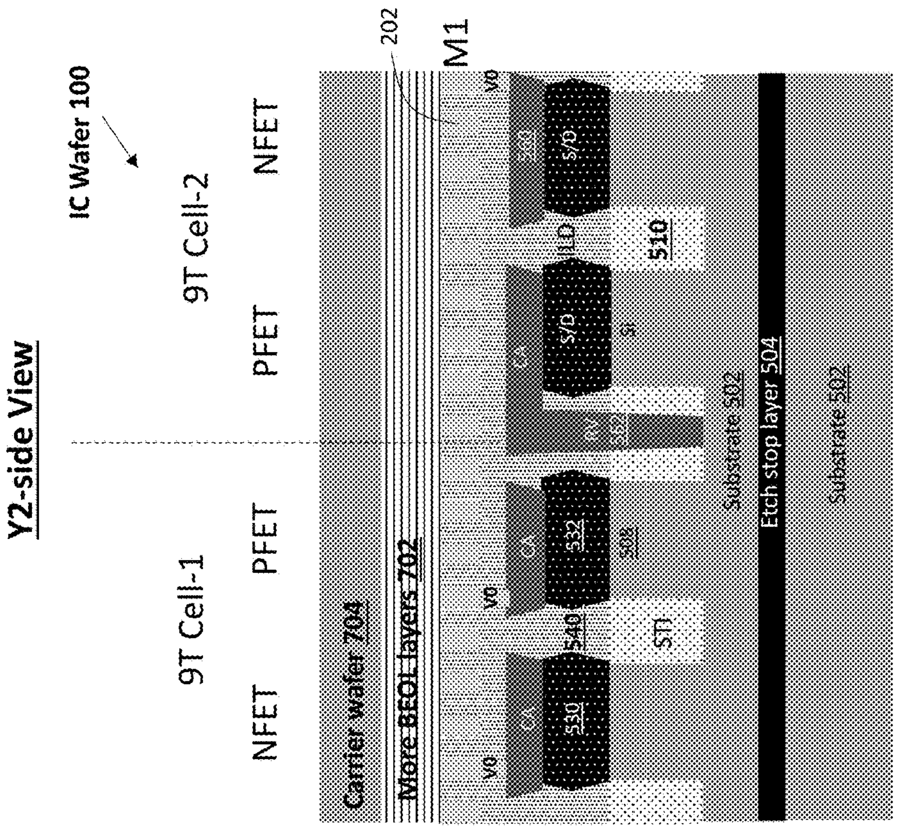
FIG. 7B depicts a Y2-side cross-sectional view of the portion of the IC wafer after fabrication operations according to embodiments of the invention.
Figure 7A:
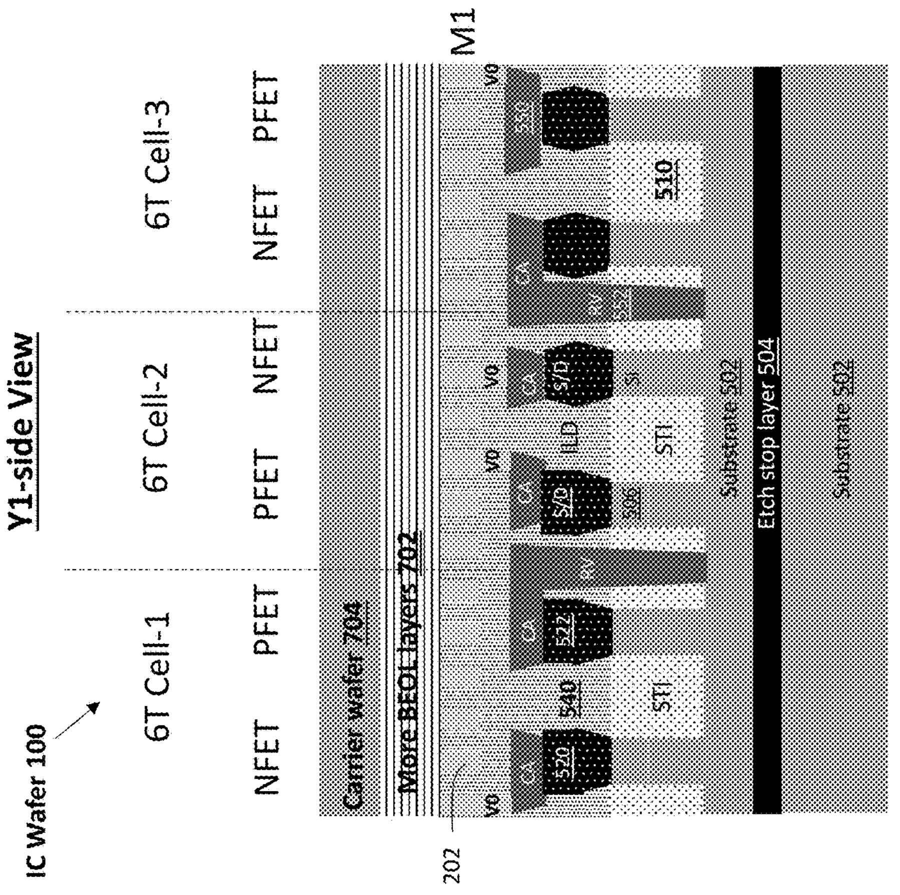
FIG. 7A depicts a Y1-side cross-sectional view of the portion of the IC wafer after fabrication operations according to embodiments of the invention.

FIGS. 7A and 7B are demonstrative illustrations of different cross-sectional views of the IC wafer 100 in steps of manufacturing thereof, subsequent to the steps illustrated in FIGS. 6A and 6B, according to embodiments of the invention. Known semiconductor fabrication operations have been performed to deposit additional BEOL layers 702 and bond a carrier wafer 704 over the additional BEOL layer 702.

Figure 8B:
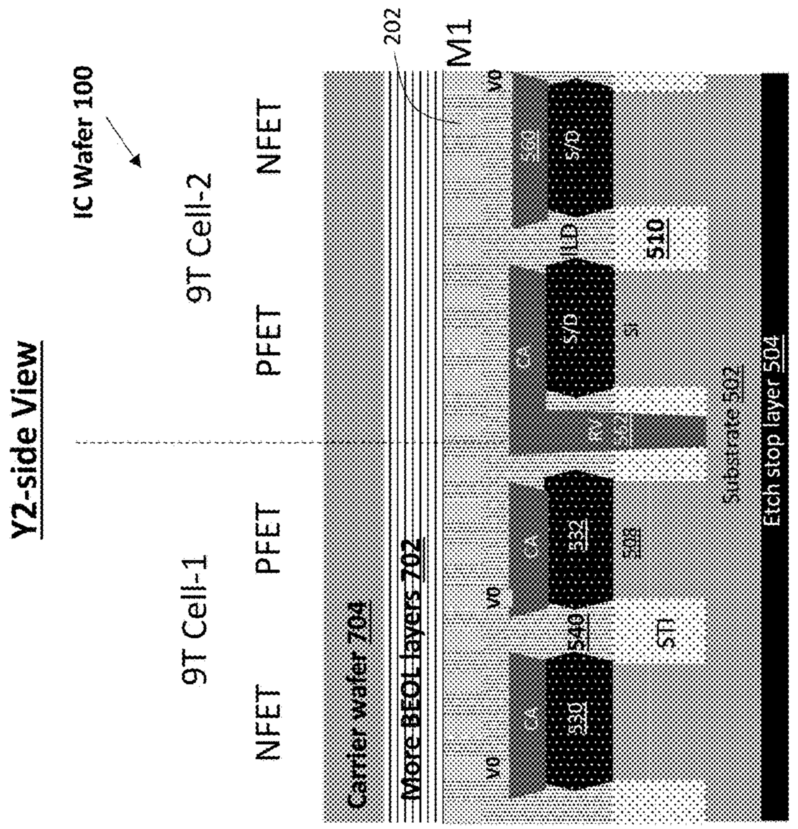
FIG. 8B depicts a Y2-side cross-sectional view of the portion of the IC wafer after fabrication operations according to embodiments of the invention.
Figure 8A:
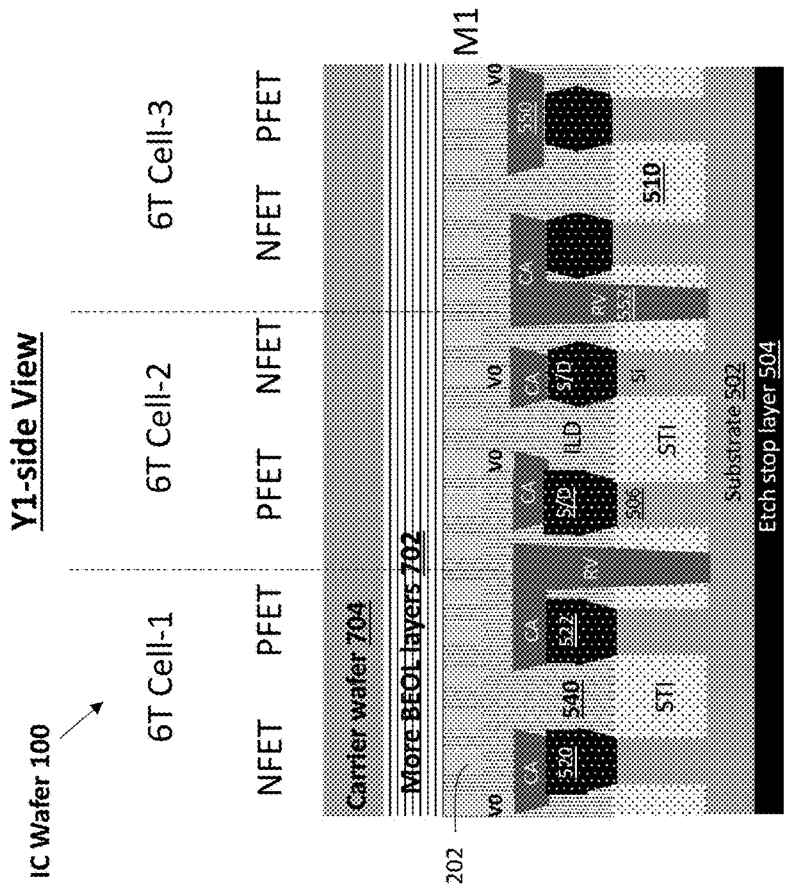
FIG. 8A depicts a Y1-side cross-sectional view of the portion of the IC wafer after fabrication operations according to embodiments of the invention.

FIGS. 8A and 8B are demonstrative illustrations of different cross-sectional views of the IC wafer 100 in steps of manufacturing thereof, subsequent to the steps illustrated in FIGS. 7A and 7B, according to embodiments of the invention. Known fabrication operations have been used to flip the wafer 100 and remove, such as through a combination of wafer grinding, CMP, dry and wet etch process, a bottom portion of the Si bulk substrate 502 and for better process control the removing process can stop at the etch stop layer 504.

Figure 9B:
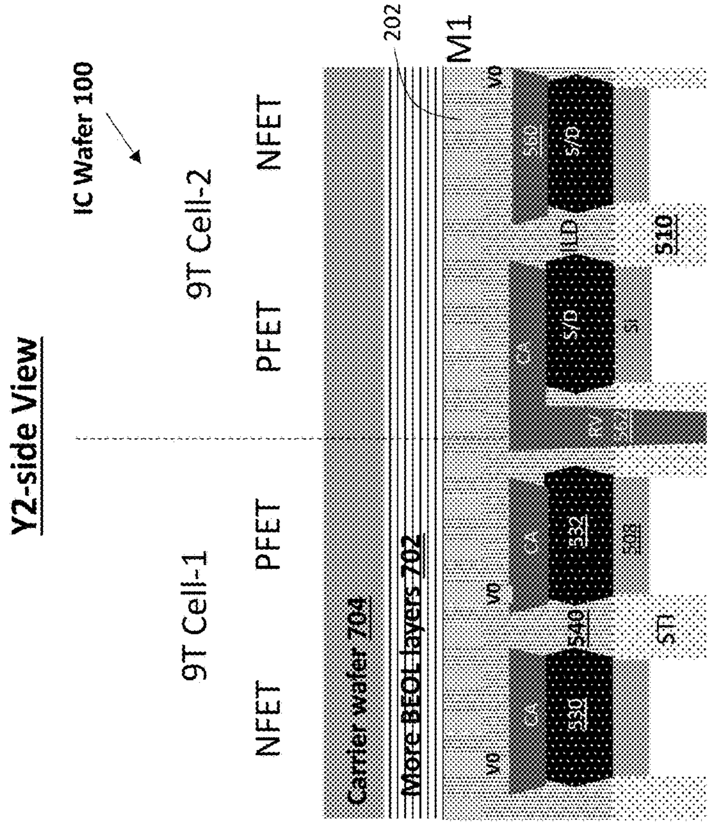
FIG. 9B depicts a Y2-side cross-sectional view of the portion of the IC wafer after fabrication operations according to embodiments of the invention.
Figure 9A:
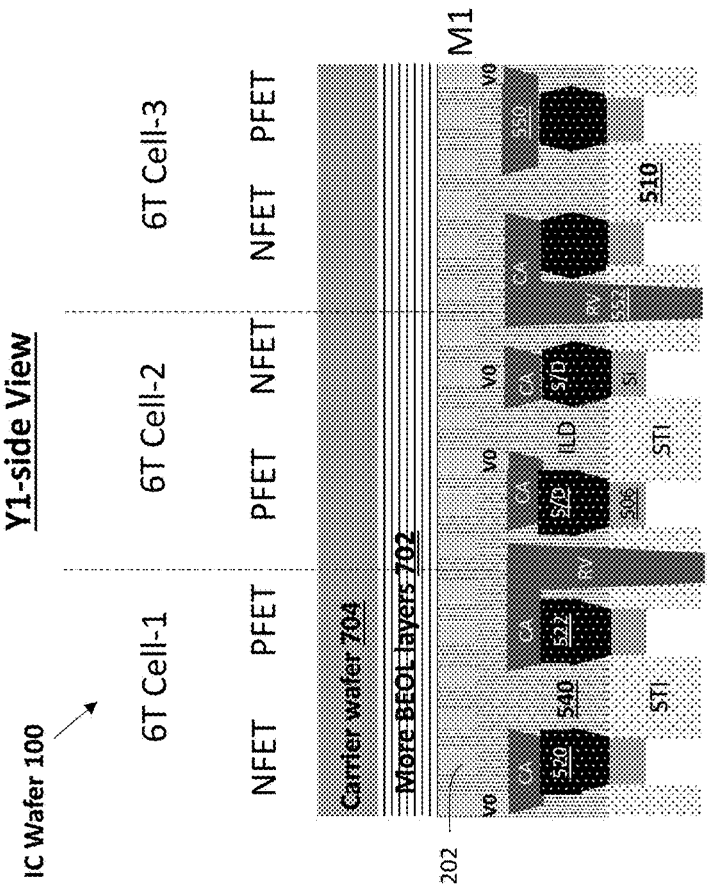
FIG. 9A depicts a Y1-side cross-sectional view of the portion of the IC wafer after fabrication operations according to embodiments of the invention.

FIGS. 9A and 9B are demonstrative illustrations of different cross-sectional views of the IC wafer 100 in steps of manufacturing thereof, subsequent to the steps illustrated in FIGS. 8A and 8B, according to embodiments of the invention. Known fabrication operations have been used to remove the etch stop layer 504 (shown in FIG. 8A, 8B), and may further continue to thin-down or etch the Si bulk substrate 502. For example, in some embodiments of the invention, a portion of the Si bulk substrate 502 can be removed until a portion of the STI layer 510 is exposed and the device channel regions (e.g. channel fins) 506, 508 are formed.

Figure 10B:
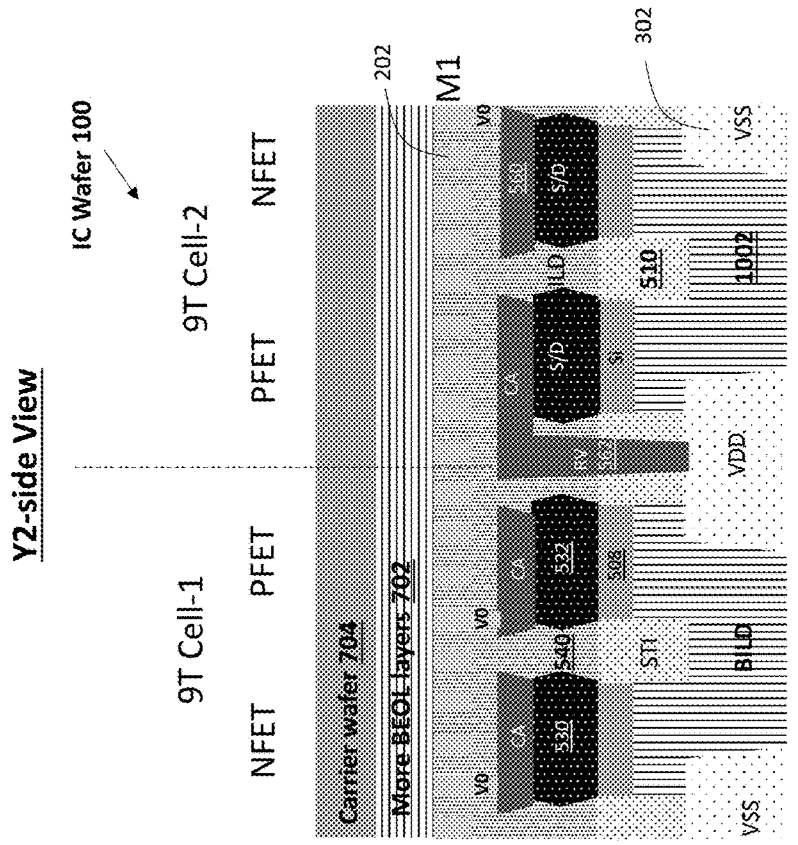
Figure 10A:
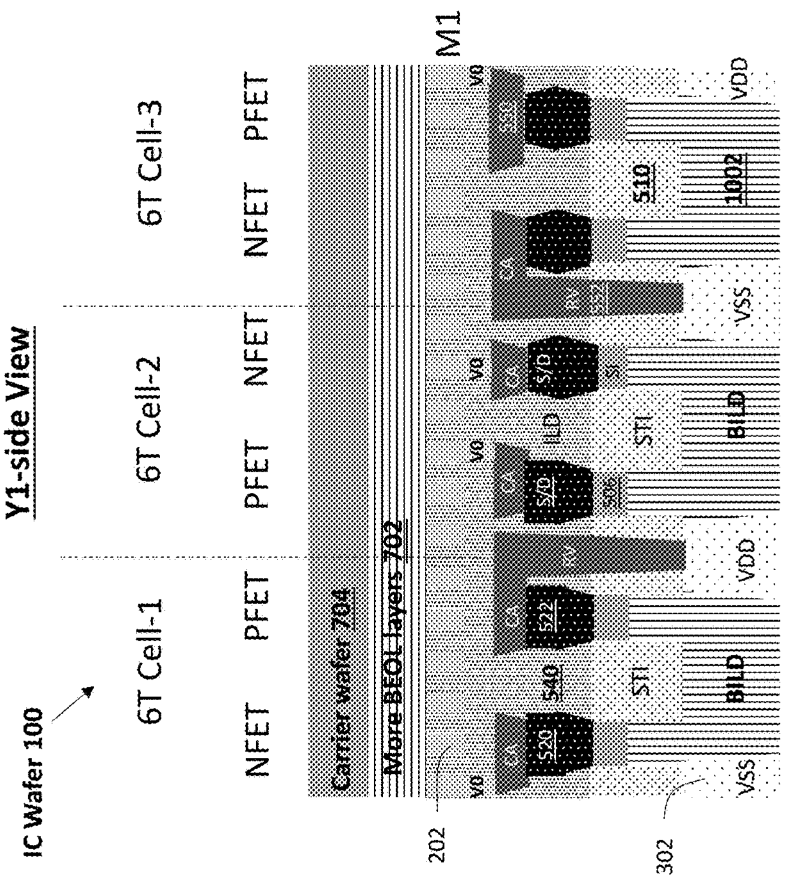
FIG. 10A depicts a Y1-side cross-sectional view of the portion of the IC wafer after fabrication operations according to embodiments of the invention.

FIGS. 10A and 10B are demonstrative illustrations of different cross-sectional views of the IC wafer 100 in steps of manufacturing thereof, subsequent to the steps illustrated in FIGS. 9A and 9B, according to embodiments of the invention. Known fabrication operations have been used to form BILD layer 1002 on top of the wafer 100 (i.e., underneath the wafer 100 as is shown in FIG. 10A and FIG. 10B), along with one or more backside power rails 302 embedded in the BILD layer. The backside power rails 302 include Vdd power rails used to power the n-type field effect transistors (NFETs), along with Vss power rails used to power the p-type FETs (PFETs).

Referring back to FIGS. 4A and 4B, there is depicted a final stage of the IC wafer 100 subsequent to the steps illustrated in FIGS. 10A and 10B according to embodiments of the invention. Known fabrication operations have been used to deposit or form a BSPDN 140 on top of the backside power rails 302 and/or the BILD layer 1002. The backside power rails 302 can be formed to be in direct contact with the RVs 552, 562, thereby connecting one or more of the contacts (CA) 550, 560 with the BSPDN 140.

Thus, it can be seen from the foregoing detailed description and the accompanying drawings that embodiments of the invention address the difficulty in fabricating mixed signal lines and power rails for cell libraries having different heights by forming the signal lines at one side of the wafer (e.g., in a BEOL region of the wafer) and forming the power rails at another side of the wafer (e.g., the backside of the wafer). By separating the relatively thin and more densely packed signal lines from the relatively thicker and spread apart power rails, the signal lines can be patterned and formed in substantially straight lines with no irregular shapes; and the power rails, by virtue of being thicker and spaced further apart, can better accommodate being formed in a patterned where power rails in the lower-height cell library (e.g., a 6T region) are not aligned with the power rails in the adjacent greater-height cell library (e.g., a 9T region).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having." "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

"Planarization" and "planarize" as used herein refer to a material removal process that employs at least mechanical forces, such as frictional media, to produce a substantially two-dimensional surface. A planarization process can include chemical mechanical polishing (CMP) or grinding. CMP is a material removal process that uses both chemical reactions and mechanical forces to remove material and planarize a surface.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A multi-layer integrated circuit (IC) having a three-dimensional structure formed along an x-axis, a y-axis, and a z-axis, the multi-layer IC comprising:

a back-end-of-line (BEOL) region at a first side of a wafer;

a backside region at a second side of the wafer that is opposite the first side of the wafer;

a set of signal lines in the BEOL region;

power rails in the backside region, the power rails comprising a first set of power rails and a second set of power rails;

a first cell and a second cell, each positioned between the BEOL region and the backside region; and wherein the first cell comprises:

first cell logic gates configured to perform a first cell logic function; and first cell tracks comprising a first portion of the set of signal lines and a first portion of power rails;

wherein the second cell comprises:

second cell logic gates configured to perform a second cell logic function; and second cell tracks comprising a second portion of the set of signal lines and a second portion of the power rails;

wherein the set of signal lines comprises a substantially constant signal-line pitch between each signal line in the set of signal lines; and wherein a first power-rail pitch between each power rail in the first set of power rails is different than a second power-rail pitch between each power rail in the second set of power rails.

2. The multi-layer IC of claim 1 further comprising a backside power distribution network (BSPDN) electrically coupled to the power rails.

3. The multi-layer IC of claim 1, wherein the first cell comprises a first cell height extending along the z-axis and defined by the first cell tracks.

4. The multi-layer IC of claim 3, wherein the second cell comprises a second cell height extending along the z-axis and defined by the second cell tracks.

5. The multi-layer IC of claim 4, wherein the second cell is positioned adjacent to the first cell.

6. The multi-layer IC of claim 5, wherein the second cell height is greater than the first cell height.

7. The multi-layer IC of claim 6, wherein:
the set of signal lines extends over the first cell and the second cell;
the first set of power rails extends under the first cell;
the second set of power rails extends under the second cell;
the set of signal lines is less thick, more densely packed, and less widely spaced than the power rails; and
locating the set of signal lines at the first side of the wafer and the set of power rails at the second side of the wafer that is opposite the first side of the wafer separates the set of signal lines from the power rails such that the set of signal lines is patterned and formed in substantially straight lines without irregular shapes, and the set of power rails, being thicker and spaced further apart than the set of signal lines, are formed in patterns that enable a coupling between the first set of power rails and the second set of power rails.

8. A multi-layer integrated circuit (IC) having a three-dimensional structure formed along an x-axis, a y-axis, and a z-axis, the multi-layer IC comprising:
a first region at a first side of a wafer;
a second region at a second side of the wafer that is opposite the first side of the wafer;
a third region of the wafer between the first region and the second region;
a set of signal lines in the first region;
power rails in the second region, the power rails comprising a first set of power rails and a second set of power rails;
a first cell positioned in the third region;
a second cell adjacent to the first cell and positioned in the third region; and
a backside power distribution network (BSPDN) electrically coupled to the power rails;
wherein the first cell comprises:
first cell logic gates configured to perform a first cell logic function; and
first cell tracks comprising a first portion of the set of signal lines and a first portion of the power rails;
wherein the second cell comprises:
second cell logic gates configured to perform a second cell logic function; and
second cell tracks comprising a second portion of the set of signal lines and a second portion of the power rails;
wherein the set of signal lines comprises a signal-line pitch between each signal line in the set of signal lines;
wherein a first power-rail pitch between each power rail in the first set of power rails is different than a second power-rail pitch between each power rail in the second set of power rails; and
wherein the first power-rail pitch and the second power-rail pitch substantially vary from one another, and the signal-line pitch does not substantially vary.

9. The multi-layer IC structure of claim 8, wherein:
the first cell comprises a first cell height extending along the z-axis and defined by the first cell tracks;
the second cell comprises a second cell height extending along the z-axis and defined by the second cell height; and
the first cell height is less than the second cell height.

10. The multi-layer IC structure of claim 9, wherein the set of signal lines extends over the first cell and over the second cell.

11. The multi-layer IC structure of claim 10, wherein the first set of power rails extends under the first cell and the second set of power rails extends under the second cell.

12. The multi-layer IC structure of claim 11, wherein the first region comprises a metal layer.

13. The multi-layer IC structure of claim 12 wherein the first side of the wafer comprises a front side of the wafer.

14. The multi-layer IC structure of claim 13, wherein the second side of the wafer comprises a backside of the wafer.

15. A multi-layer integrated circuit (IC) structure comprising:
a back-end-of-line (BEOL) region at a first side of a wafer;
a backside region at a second side of the wafer that is opposite the first side of the wafer;
a front-end-of-line (FEOL) region of the wafer between the BEOL region and the backside region;
a set of signal lines in the BEOL region;
power rails in the backside region, the power rails comprising a first set of power rails and a second set of power rails;
a first cell positioned in the FEOL region and having a first cell height;
a second cell adjacent to the first cell, positioned in the FEOL region, and having a second cell height that is greater than the first cell height; and
a backside power distribution network (BSPDN) electrically coupled to the set of power rails;
wherein the first cell comprises:
first cell logic gates configured to perform a first cell logic function; and
first cell tracks comprising a first portion of the set of signal lines and a first portion of the power rails;
wherein the second cell comprises:
second cell logic gates configured to perform a second cell logic function; and
second cell tracks comprising a second portion of the set of signal lines and a second portion of the power rails;
wherein the set of signal lines comprises a signal-line pitch between each signal line in the set of signal lines;
wherein a first power-rail pitch between each power rail in the first set of power rails is different than a second power-rail pitch between each power rail in the second set of power rails; and
wherein the first power-rail pitch and the second power-rail pitch substantially vary from one another, and the signal-line pitch does not substantially vary.

16. The multi-layer IC structure of claim 15, wherein:
the first cell height extends along the z-axis and is defined by the first cell tracks; and
the second cell height extends along the z-axis and is defined by the second cell height.

17. The multi-layer IC structure of claim 16, wherein:
the first cell logic gates are electrically coupled to the set of signal lines and the first set of power rails; and
the second cell logic gates are electrically coupled to the set of signal lines and the second set of power rails.

18. The multi-layer IC structure of claim 17, wherein a width dimension of each signal line in the set of signal lines is less than width dimensions of power rails in the first set of power rails and power rails the second set of power rails.

19. The multi-layer IC structure of claim 18, wherein each of the first power-rail pitch and the second power-rail pitch is greater than the signal-line pitch that does not substantially vary.

* * * * *